(12) United States Patent
Tang et al.

(10) Patent No.: US 12,446,256 B2
(45) Date of Patent: Oct. 14, 2025

(54) POWER DEVICE AND METHOD FOR MANUFACTURING THE SAME

(71) Applicants: NIKO SEMICONDUCTOR CO., LTD., New Taipei (TW); SUPER GROUP SEMICONDUCTOR CO., LTD., Hsinchu County (TW)

(72) Inventors: Sung-Nien Tang, Hsinchu County (TW); Ho-Tai Chen, Hsinchu County (TW); Hsiu-Wen Hsu, Hsinchu County (TW)

(73) Assignees: NIKO SEMICONDUCTOR CO., LTD., New Taipei (TW); SUPER GROUP SEMICONDUCTOR CO., LTD., Hsinchu County (TW)

( * ) Notice: Subject to any disclaimer, the term of this patent is extended or adjusted under 35 U.S.C. 154(b) by 480 days.

(21) Appl. No.: 18/123,164

(22) Filed: Mar. 17, 2023

(65) Prior Publication Data

US 2024/0194776 A1    Jun. 13, 2024

(30) Foreign Application Priority Data

Dec. 7, 2022 (TW) .................. 111146869

(51) Int. Cl.
| | | |
|---|---|---|
| H01L 29/78 | (2006.01) | |
| H01L 23/495 | (2006.01) | |
| H10D 30/01 | (2025.01) | |
| H10D 30/66 | (2025.01) | |
| H10D 64/00 | (2025.01) | |

(52) U.S. Cl.
CPC ....... *H10D 30/66* (2025.01); *H01L 23/49562* (2013.01); *H10D 30/0291* (2025.01); *H10D 64/111* (2025.01)

(58) Field of Classification Search
None
See application file for complete search history.

(56) References Cited

U.S. PATENT DOCUMENTS

2014/0209999 A1* 7/2014 Sato .................... H10D 64/117
                                                438/270

* cited by examiner

*Primary Examiner* — William C Trapanese
(74) *Attorney, Agent, or Firm* — Li & Cai Intellectual Property (USA) Office (57) ABSTRACT

A power device and a method for manufacturing the power device are provided. The power device includes an electrical substrate, an epitaxial compound layer, a plurality of gates, a passivation layer, an electrically conductive body, a drain, and a field plate. The electrical substrate has a first surface, an epitaxial drift layer, and a plurality of doping regions. The doping regions are located below the first surface. The epitaxial compound layer is located on the electrical substrate. The gates are located on the epitaxial compound layer. The passivation layer covers the gates and the epitaxial compound layer. The electrically conductive body penetrates the passivation layer and the epitaxial compound layer and extends to the first surface. The drain penetrates the passivation layer and extends to the epitaxial layer. The field plate is located on the passivation layer, shields the gates, and connects to the electrically conductive body.

9 Claims, 10 Drawing Sheets

POWER DEVICE AND METHOD FOR MANUFACTURING THE SAME

CROSS-REFERENCE TO RELATED PATENT APPLICATION

This application claims the benefit of priority to Taiwan Patent Application No. 111146869, filed on Dec. 7, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power device, and more particularly to a power device that integrates field-effect transistors and Schottky diodes.

BACKGROUND OF THE DISCLOSURE

Power semiconductor devices are at the very core of electrical power supply and electrical power control applications, and provide the functions of reducing an on-state resistance and improving electrical power conversion efficiency. Among these semiconductor devices, metal oxide semiconductor field-effect transistors (MOSFETs) are a type thereof that is widely used.

In compound semiconductors, materials such as silicon carbide (SiC) and gallium nitride (GaN) are extensively used in high-power, high-frequency, and high-temperature electronic power systems due to the characteristics of providing fast operation speed and resistance to high temperatures and high voltages. GaN has good stability, and has a melting point that is greater than 1,700° C. In addition to advantages such as good stability and resistance to high temperatures and high voltages, GaN also has good electrical and thermal conductivity and is used in transformers and chargers.

Therefore, how to modify the structure of MOSFETs to improve the efficiency of the power semiconductor devices has become one of the important issues to be solved in the industry.

SUMMARY OF THE DISCLOSURE

In response to the above-referenced technical inadequacies, the present disclosure provides a power device and a method for manufacturing the power device.

In one aspect, the present disclosure provides a method for manufacturing a power device. The method includes steps as follows: providing an electrical substrate having a first surface and a second surface that is opposite to the first surface, and an electrode layer that is located on the second surface, the electrical substrate further having an epitaxial drift layer, and the epitaxial drift layer being doped with a first electrically conductive dopant; doping the first surface with a second electrically conductive dopant to form a plurality of doping regions, any two adjacent ones of the doping regions being spaced apart by a gap, and the first electrically conductive dopant and the second electrically conductive dopant having opposite electrical charges; forming an epitaxial compound layer on the electrical substrate, and the epitaxial compound layer including an epitaxial layer; disposing a plurality of gates on the epitaxial compound layer, and each of the plurality of gates being made of a first electrically conductive material; forming a passivation layer that covers the plurality of gates and the epitaxial compound layer; forming a first trench that extends from a surface of the passivation layer to the first surface and has a first end opening and a second end opening, the first end opening being located between two of the gates that are adjacent to each other, the second end opening being located above the gap, and a width of the second end opening being greater than the gap; filling a second electrically conductive material in the first trench to form a source contact at the first end opening, and form a Schottky barrier contact at the second end opening; forming a second trench that extends from the surface of the passivation layer to a surface of the epitaxial layer; and filling a third electrically conductive material in the second trench to form a drain; disposing a field plate on the passivation layer, and the field plate shielding the plurality of gates and the source contact and being in electrical connection with the source contact.

In certain embodiments, the method further includes steps as follows: disposing a lead frame in connection with the electrode layer; disposing a first metal pin, two ends of the first metal pin being in connection with the drain and the lead frame, respectively; and disposing a second metal pin that is in connection with the source contact.

In certain embodiments, the method further includes steps as follows: etching the passivation layer and the epitaxial compound layer so as to expose one portion of the first surface to define an exposed portion; disposing a lead frame in connection with the electrode layer; disposing a first metal pin, and two ends of the first metal pin being in connection with the drain and the lead frame, respectively; and disposing a second metal pin that has a main portion and an extension portion, the main portion being in connection with the source contact, and two ends of the extension portion being in connection with the main portion and the exposed portion, respectively.

In certain embodiments, the electrical substrate is a silicon carbide substrate, the first electrically conductive dopant is an N-type dopant, the second electrically conductive dopant is a P-type dopant, and the epitaxial layer is a gallium nitride epitaxial layer.

In another aspect, the present disclosure provides a power device. The power device includes an electrical substrate, an epitaxial compound layer, a plurality of gates, a passivation layer, an electrically conductive body, a drain, and a field plate. The electrical substrate has a first surface and a second surface that is opposite to the first surface, and an electrode layer that is located on the second surface. The electrical substrate further has an epitaxial drift layer and a plurality of doping regions, and the epitaxial drift layer is doped with a first electrically conductive dopant. The doping regions are located below the first surface and any two adjacent ones of the doping regions are spaced apart by a gap, and each of the doping regions is doped with a second electrically conductive dopant. The epitaxial compound layer located on the electrical substrate and includes an epitaxial layer. The plurality of gates located on the epitaxial compound layer. The passivation layer covers the plurality of gates and the epitaxial compound layer. The electrically conductive body penetrates the passivation layer and the epitaxial compound layer and extends to the first surface, and a width of the electrically conductive body is greater than the gap. The drain penetrates the passivation layer and extends to the epitaxial layer. The field plate is located on the passivation layer, the field plate shields the plurality of gates and the electrically conductive body, and the field plate is in electrical connection with the electrically conductive body.

In certain embodiments, the power device further includes a lead frame, a first metal pin, and a second metal pin. The lead frame is in connection with the electrode layer, two ends of the first metal pin are in connection with the drain and the lead frame, respectively, and the second metal pin is in connection with the electrically conductive body.

In certain embodiments, one portion of the first surface that does not have the epitaxial compound layer is defined as an exposed portion. The second metal pin has a main portion and an extension portion. The main portion is in connection with the electrically conductive body, and two ends of the extension portion are in connection with the main portion and the exposed portion, respectively.

Therefore, in the power device and the method for manufacturing the power device of the present disclosure, by technical solutions of manufacturing a field-effect transistor on the electrical substrate and using the electrical substrate having the junction barrier Schottky to form a Schottky diode, the field-effect transistor can be integrated so that a Schottky diode can be disposed between a source and a drain of the field-effect transistor. In this way, the power device can release the inductance current received by the source to withstand a greater forward voltage.

Furthermore, in one implementation of the present disclosure, a gallium nitride epitaxial layer is grown on a silicon carbide substrate to form a gallium nitride field-effect transistor. Furthermore, the silicon carbide substrate has the junction barrier Schottky, and a thermal mismatch between the gallium nitride epitaxial layer and the silicon carbide substrate is decreased, so as to facilitate manufacturing of the gallium nitride field-effect transistor on the silicon carbide substrate having the junction barrier Schottky. In this way, the abovementioned effect of having the Schottky diode disposed between the source and the drain of the field-effect transistor can be achieved, and the functions of the Schottky diode can be exhibited.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiments

Figure 1:
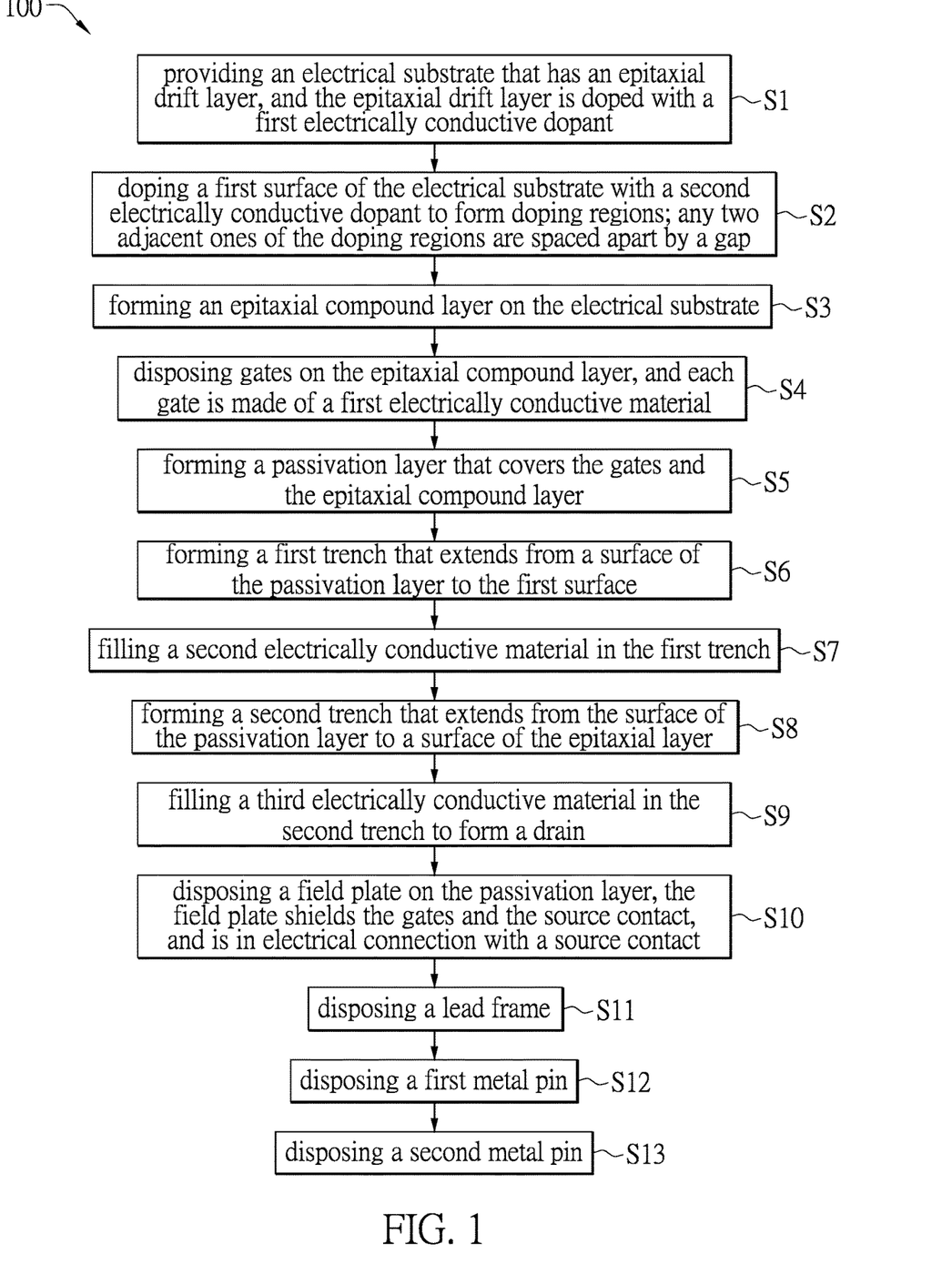
FIG. 1 is a schematic flowchart of a method for manufacturing a power device according to one embodiment of the present disclosure.
Figure 3:
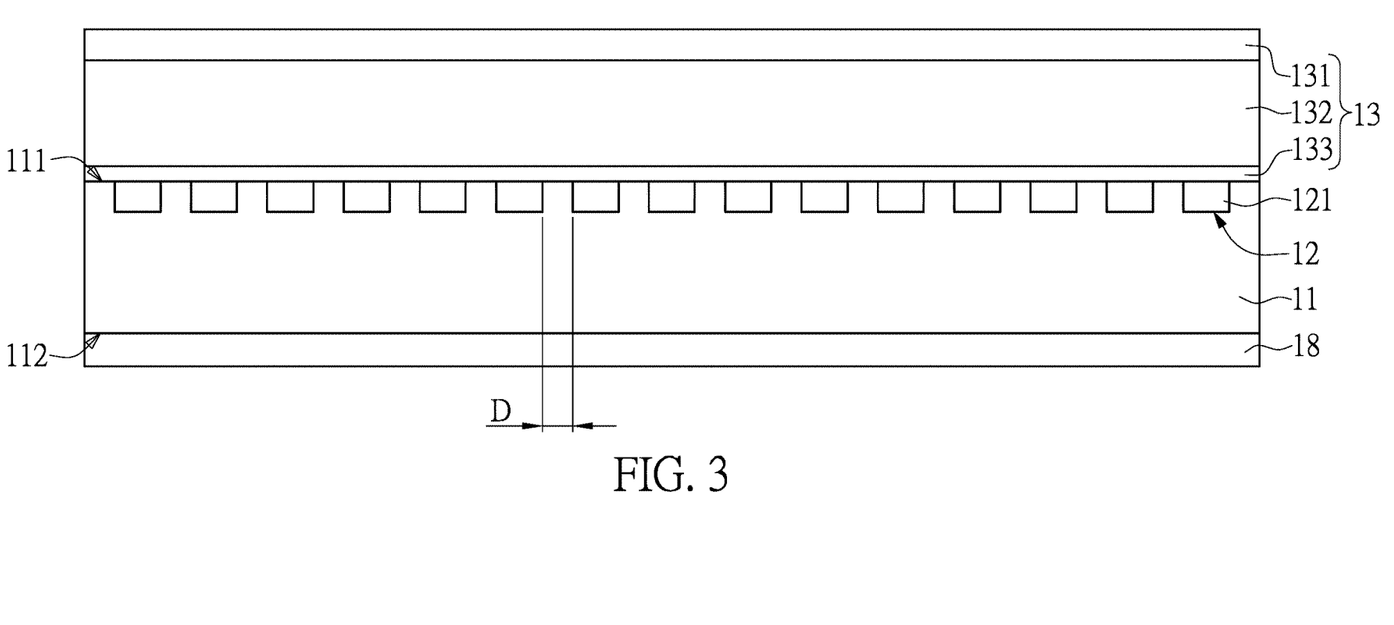
FIG. 3 is a schematic view of step S3 of the flowchart according to the embodiment as shown in FIG. 1.
Figure 4:
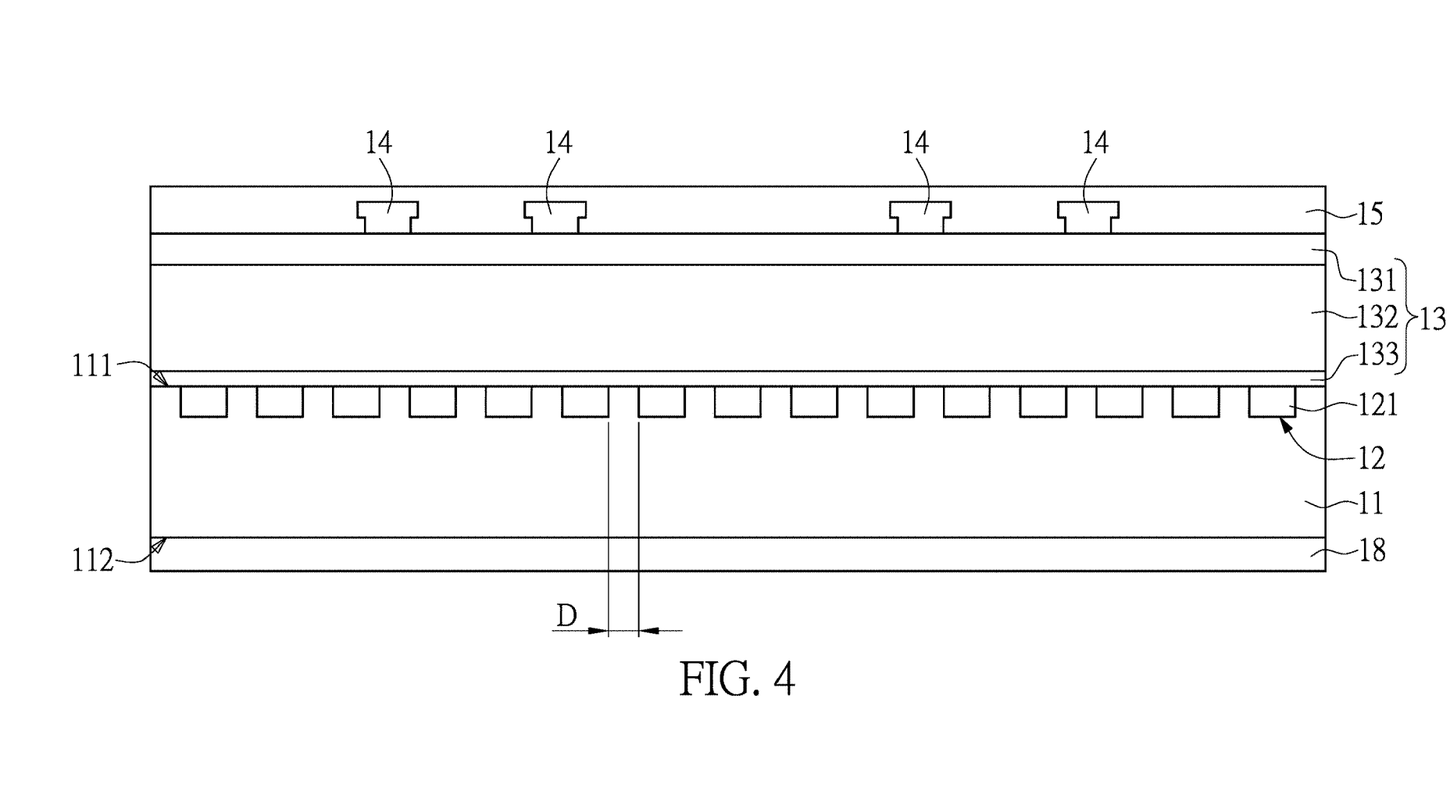
FIG. 4 is a schematic view of step S4 and step S5 of the flowchart according to the embodiment as shown in FIG. 1.
Figure 5:
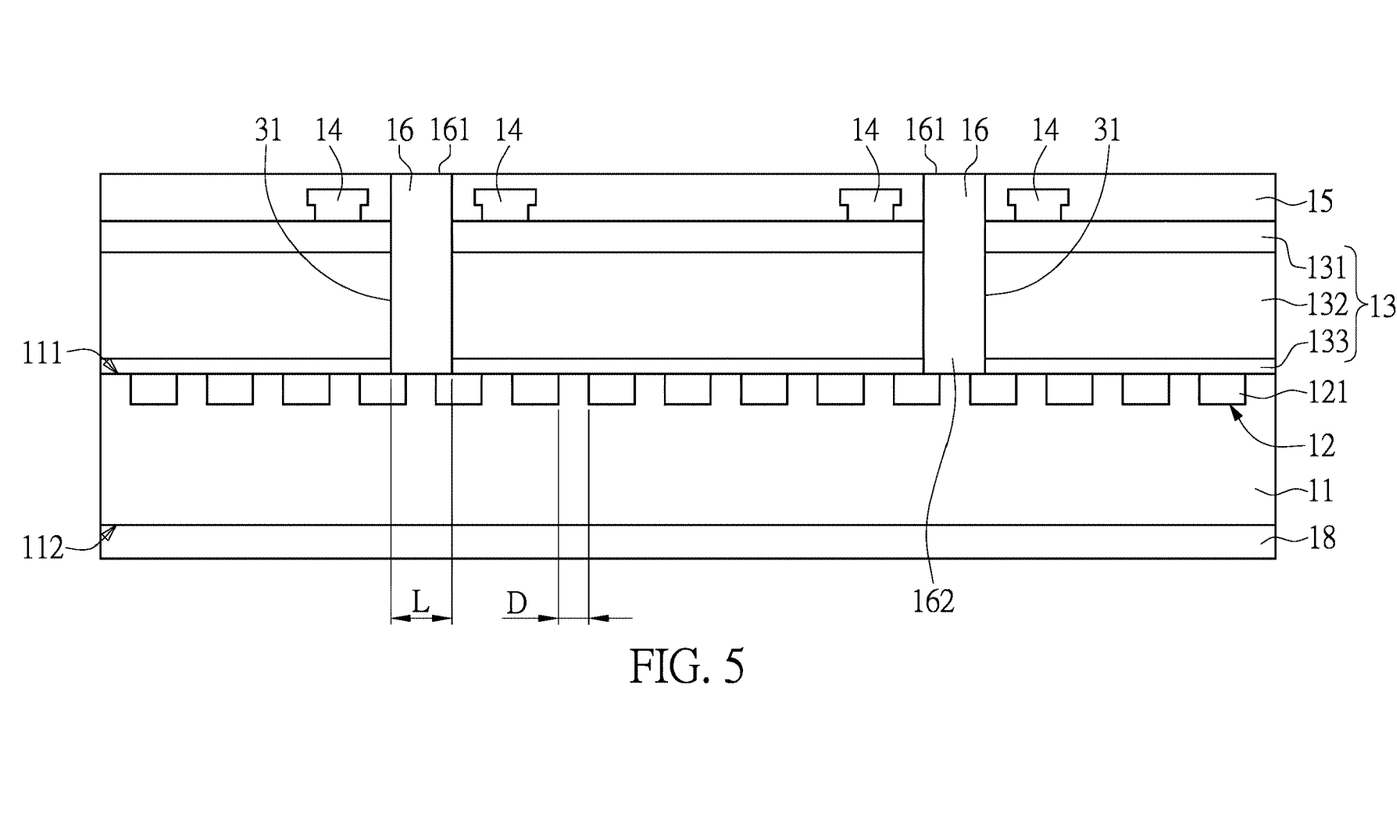
FIG. 5 is a schematic view of step S6 and step S7 of the flowchart according to the embodiment as shown in FIG. 1.
Figure 6:
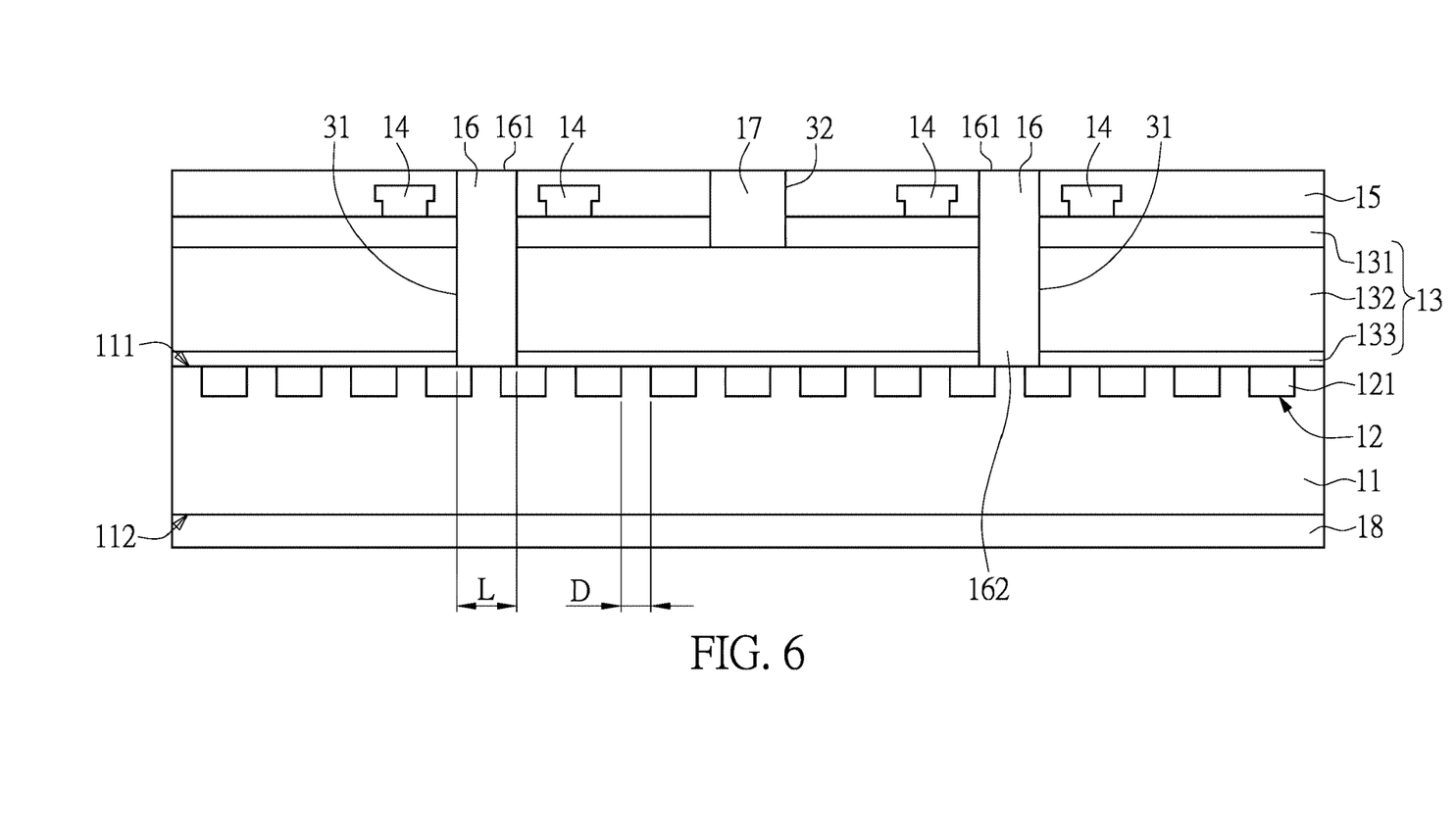
FIG. 6 is a schematic view of step S8 and step S9 of the flowchart according to the embodiment as shown in FIG. 1.
Figure 7:
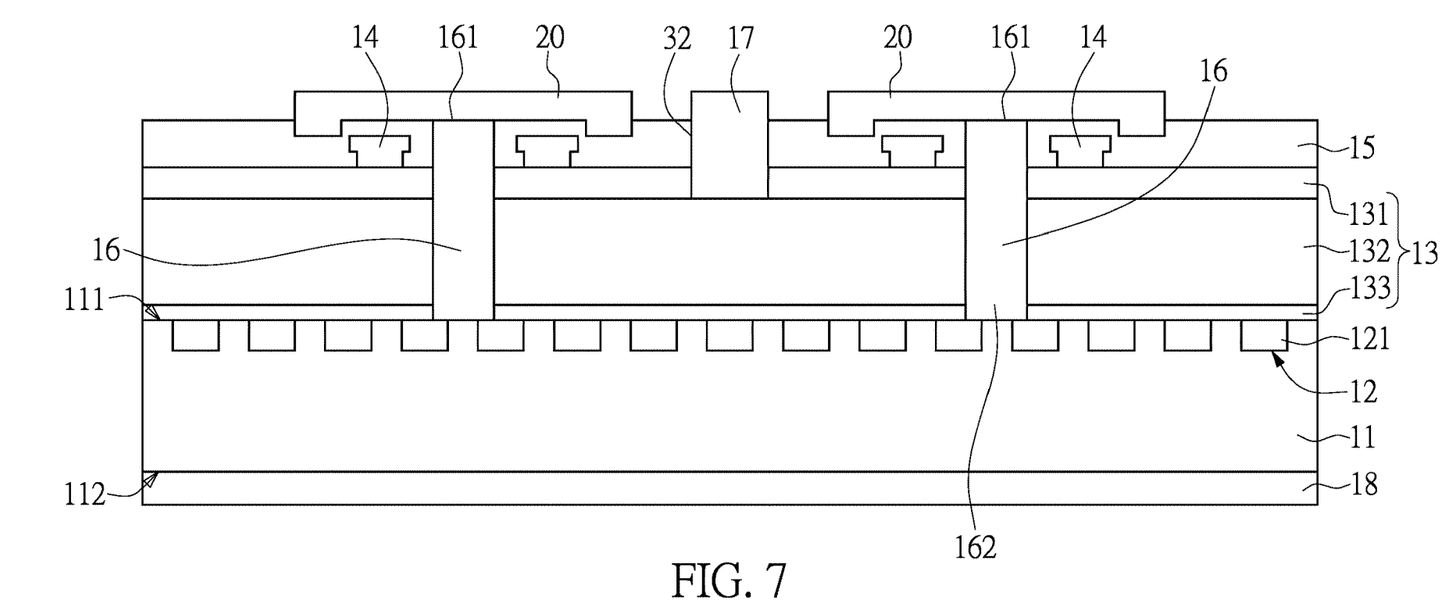
FIG. 7 is a schematic view of step S10 of the flowchart according to the embodiment as shown in FIG. 1.

Referring to FIG. 1, FIG. 1 is a schematic flowchart of a method for manufacturing a power device according to one embodiment of the present disclosure. Referring to FIG. 2 to FIG. 7, FIG. 2 is a schematic view of step S1 and step S2 of the flowchart according to the embodiment as shown in FIG. 1. FIG. 3 is a schematic view of step S3 of the flowchart according to the embodiment as shown in FIG. 1. FIG. 4 is a schematic view of step S4 and step S5 of the flowchart according to the embodiment as shown in FIG. 1. FIG. 5 is a schematic view of step S6 and step S7 of the flowchart according to the embodiment as shown in FIG. 1. FIG. 6 is a schematic view of step S8 and step S9 of the flowchart according to the embodiment as shown in FIG. 1. FIG. 7 is a schematic view of step S10 of the flowchart according to the embodiment as shown in FIG. 1.

A method 100 for manufacturing a power device according to the present disclosure includes steps as follows. Step S1: providing an electrical substrate 11 having a first surface 111 and a second surface 112 that is opposite to the first surface 111, and an electrode layer 18 that is located on the second surface 112, the electrical substrate 11 further having an epitaxial drift layer, and the epitaxial drift layer being doped with a first electrically conductive dopant. Step S2: doping the first surface 111 with a second electrically conductive dopant 121 to form a plurality of doping regions 12, any two adjacent ones of the doping regions 12 being spaced apart by a gap D, and the first electrically conductive dopant and the second electrically conductive dopant 121 having opposite electrical charges. Step S3: forming an epitaxial compound layer 13 on the electrical substrate 11, and the epitaxial compound layer 13 including an epitaxial layer 132. Step S4: disposing a plurality of gates 14 on the epitaxial compound layer 13, and each of the plurality of gates 14 being made of a first electrically conductive material. Step S5: forming a passivation layer 15 that covers the plurality of gates 14 and the epitaxial compound layer 13. Step S6: forming a first trench 31 that extends from a surface of the passivation layer 15 to the first surface 111 and has a first end opening and a second end opening, the first end opening being located between two of the gates 14 that are adjacent to each other, the second end opening being located above the gap D, and a width of the second end opening being greater than the gap D. Step S7: filling a second electrically conductive material 16 in the first trench 31 to form a source contact 161 at the first end opening, and form a Schottky barrier contact 162 at the second end opening. Step S8: forming a second trench 32 that extends from the surface of the passivation layer 15 to a surface of the epitaxial layer 132. Step S9: filling a third electrically conductive material in the second trench 32 to form a drain 17. Step S10: disposing a field plate 20 on the passivation layer 15, and the field plate 20 shielding the plurality of gates 14 and the source contact 161 and being in electrical connection with the source contact 161.

Figure 2:
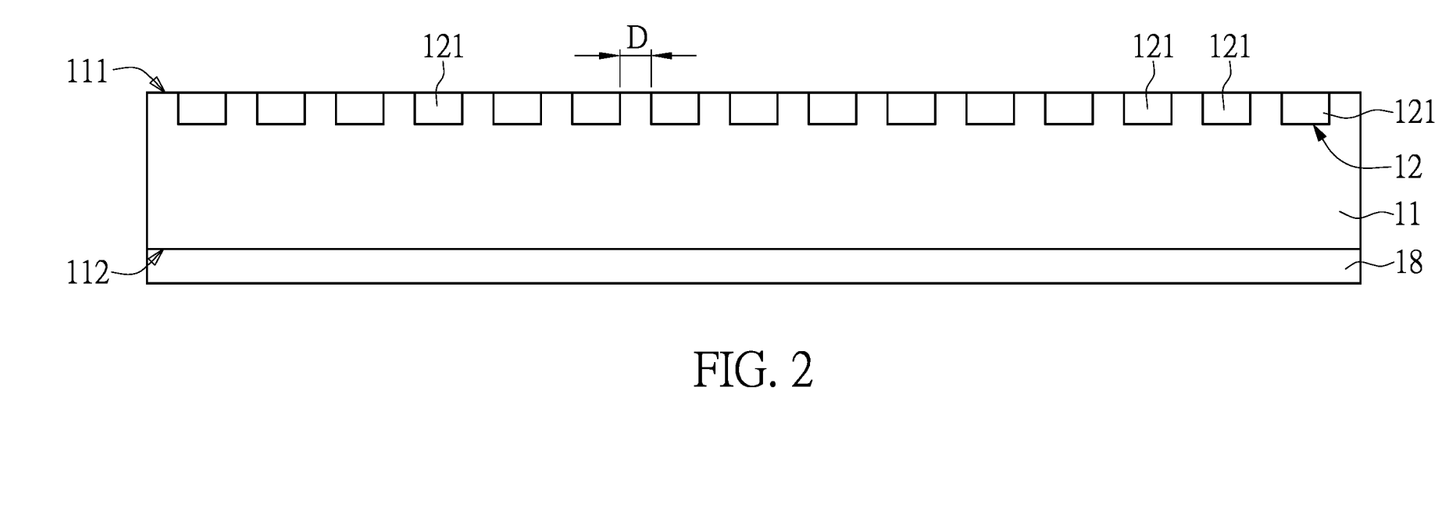
FIG. 2 is a schematic view of step S1 and step S2 of the flowchart according to the embodiment as shown in FIG. 1.

As shown in FIG. 2, the electrical substrate 11 has the first surface 111 and the second surface 112 that is opposite to the first surface 111, and the electrode layer 18 is located on the second surface 112. The electrode layer 18 is in electrical connection with a lead frame 19 (which will be described in detail below). An epitaxial drift layer of the electrical substrate 11 has a low concentration, and the epitaxial drift layer is doped with the first electrically conductive dopant. A concentration of the first electrically conductive dopant is lower than an intrinsic element of the electrical substrate 11. The intrinsic element of the electrical substrate 11 can be silicon carbide, and the first electrically conductive dopant can be a P-type dopant or an N-type dopant. The plurality of doping regions 12 are located below the first surface 111, and each of the doping regions 12 include the second electrically conductive dopant 121. Electrical charges of the second electrically conductive dopant 121 are opposite to electrical charges of the first electrically conductive dopant. The doping as mentioned in the present disclosure can be performed via thermal diffusion or ion implantation, and the present disclosure is not limited thereto. Any two adjacent ones of the doping regions 12 are spaced apart by the gap D, and two sides of each of the doping regions form a P-N junction. A size of the gap D is determined by concentrations of the first electrically conductive dopant and the second electrically conductive dopant 121 contained in the electrical substrate 11, and the present disclosure is not limited thereto.

As shown in FIG. 3, the epitaxial compound layer 13 is formed on the electrical substrate 11, and the epitaxial compound layer 13 includes the epitaxial layer 132. In certain embodiments, the epitaxial compound layer 13 includes a buffer layer 133, the epitaxial layer 132, and a barrier layer 131. In certain embodiments, the epitaxial layer 132 can be a gallium nitride (GaN) epitaxial layer, the buffer layer 133 can be an aluminum nitride (AlN) layer, and the barrier layer 131 can be an aluminum gallium nitride (AlGaN) layer.

As shown in FIG. 4, the plurality of gates 14 are disposed on the epitaxial compound layer 13, and the passivation layer 15 covers the plurality of gates 14 and the epitaxial compound layer 13. Each of the plurality of gates 14 is made of the first electrically conductive material, and can be made of tantalum, tungsten, tantalum nitride, etc., and it is not limited thereto. According to certain embodiments, the passivation layer 15 is a silicon nitride layer or a silicon dioxide layer.

As shown in FIG. 5, the first trench 31 extends from the surface of the passivation layer 15 to the first surface 111, and the first end opening of the first trench 31 is located between two of the gates 14 that are adjacent to each other. The second end opening of the first trench 31 is located above the gap D, and a width L of the second end opening is greater than the gap D. In certain embodiments, the first trench 31 is formed by etching or using a photomask. Then, the second electrically conductive material 16 is filled in the first trench 31, the source contact 161 is formed at the first end opening, and a Schottky barrier contact 162 is formed at the second end opening. According to certain embodiments, the second electrically conductive material 16 is a metal or an alloy.

As shown in FIG. 6, the second trench 32 extends from the surface of the passivation layer 15 to the surface of the epitaxial layer 132. In certain embodiments, the second trench 32 is formed by etching or using a photomask. Then, the third electrically conductive material is filled in the second trench 32 to form the drain 17. As shown in FIG. 7, the field plate 20 is disposed on the passivation layer 15, and the field plate 20 shields the plurality of gates 14 and the source contact 161 and is in electrical connection with the source contact 161.

Figure 8:
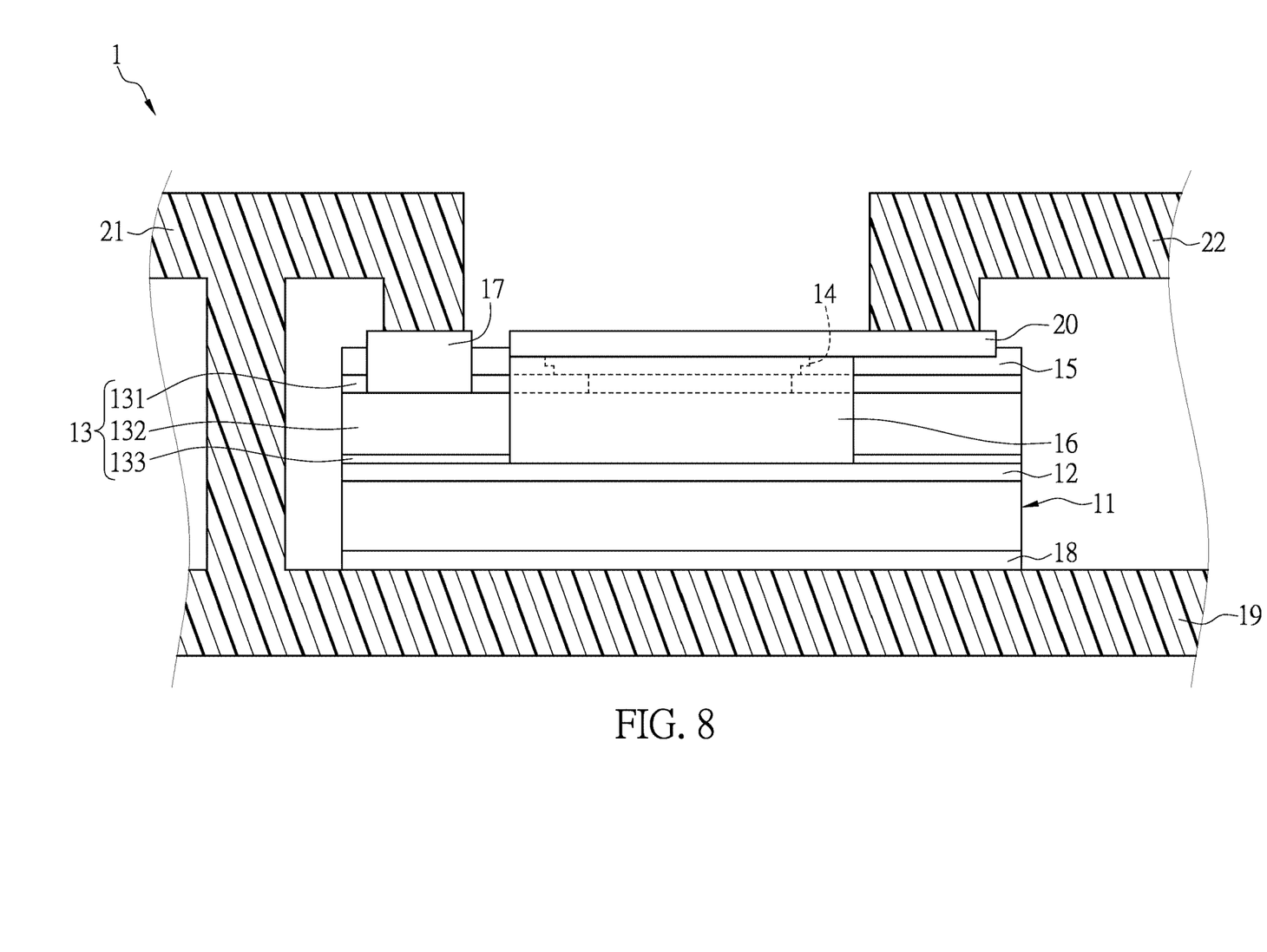
FIG. 8 is a schematic view of step S11 to step S13 of the flowchart according to the embodiment as shown in FIG. 1.

Referring to FIG. 8, FIG. 8 is a schematic view of step S11 to step S13 of the flowchart according to the embodiment as shown in FIG. 1. According to the embodiment as show in FIG. 8, the method 100 for manufacturing the power device further includes steps as follows. Step S11: disposing a lead frame 19, and the lead frame 19 being in connection with the electrode layer 18. Step S12: disposing a first metal pin 21, and two ends of the first metal pin 21 being in connection with the drain 17 and the lead frame 19, respectively. Step S13: disposing a second metal pin 22 that is in connection with the source contact 161. The electrode layer 18 is used as a back contact and is in connection with the lead frame 19. According to certain embodiments, the electrode layer 18 has high concentration of N-type electrically conductive dopant. The two ends of the first metal pin 21 are in connection with the drain 17 and the lead frame 19, respectively. One end of the second metal pin 22 is in contact with the source contact 161, and another end of the second metal pin 22 is in contact with electronic components.

Figure 9:
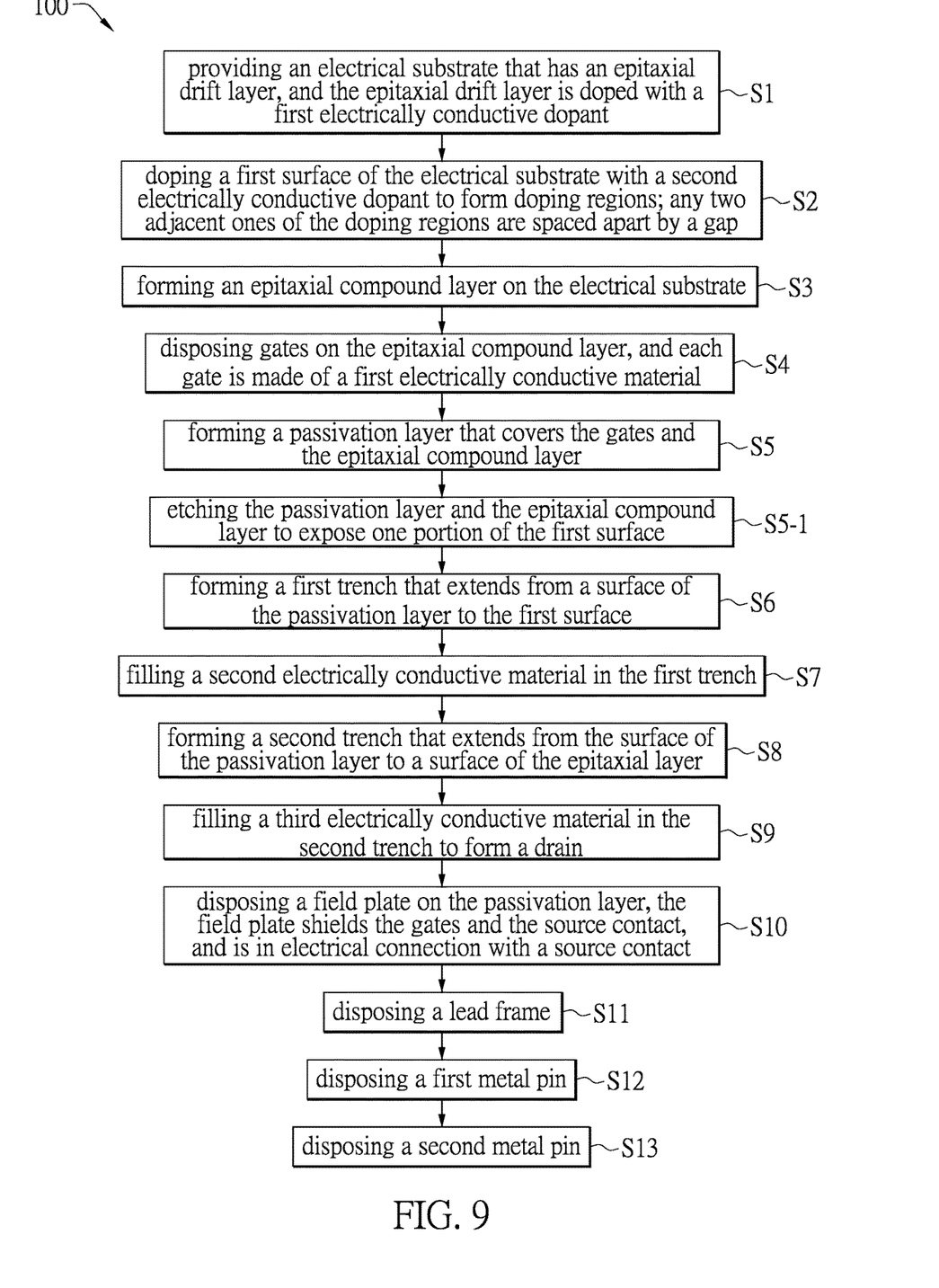
FIG. 9 is a schematic flowchart of a method for manufacturing a power device according to another embodiment of the present disclosure.
Figure 10:
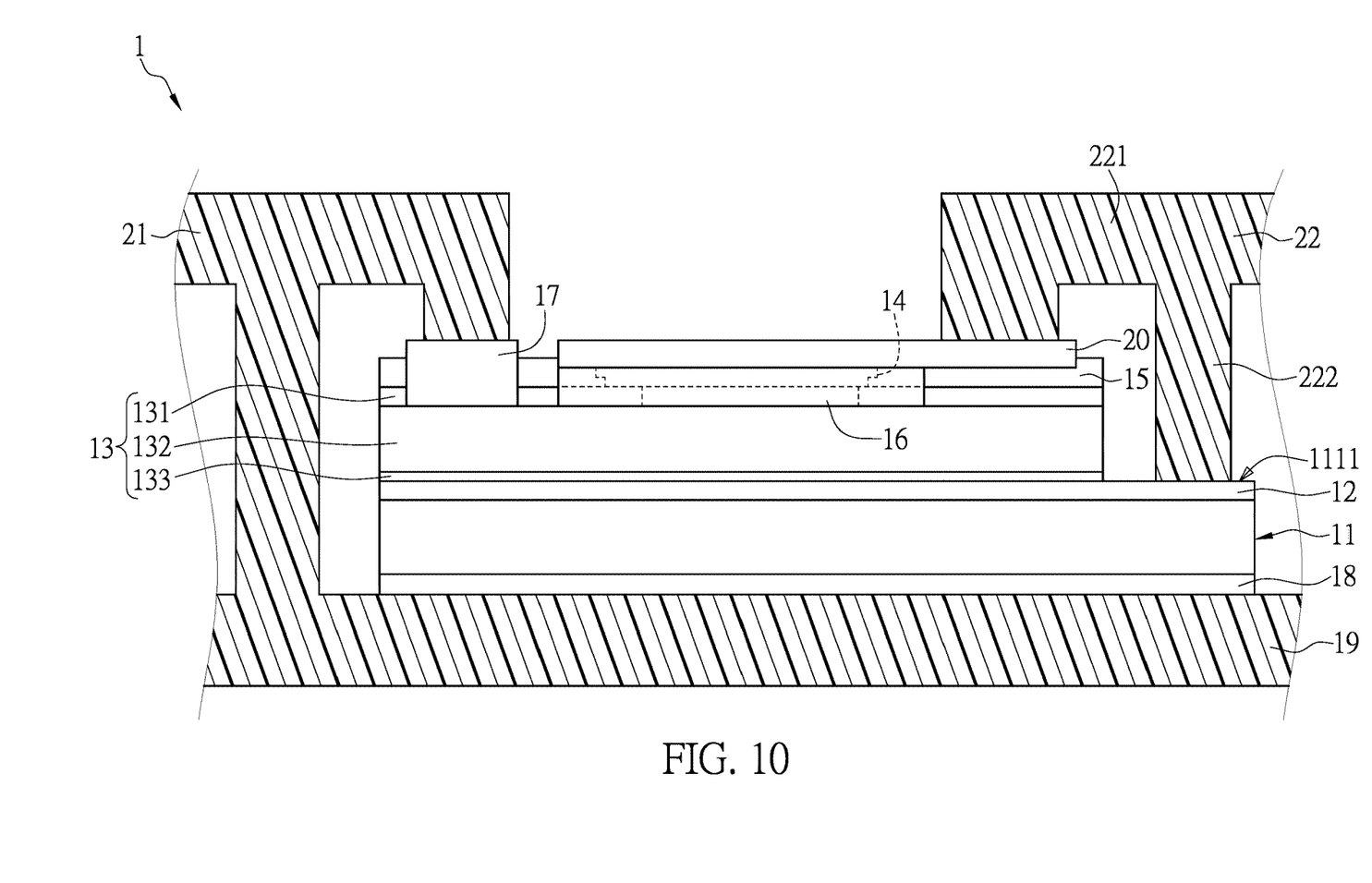
FIG. 10 is a schematic view of the power device according to the embodiment as shown in FIG. 9.

Referring to FIG. 9 and FIG. 10, FIG. 9 is a schematic flowchart of a method for manufacturing a power device according to another embodiment of the present disclosure, and FIG. 10 is a schematic view of the power device according to the embodiment as shown in FIG. 9. According to the embodiment as shown in FIG. 9, the method 100 for manufacturing the power device further includes a step as follows. Step S5-1: etching the passivation layer 15 and the epitaxial compound layer 13 so as to expose one portion of the first surface 111 to define an exposed portion 1111. Step S5-1 can be implemented after step S5, or implemented after step S9 or step S10, and the present disclosure is not limited thereto. In this embodiment, in step S13, the second metal pin 22 has a main portion 221 and an extension portion 222. One end of the main portion 221 is in connection with the source contact 161, and two ends of the extension portion 222 are in connection with the main portion 221 and the exposed portion 1111, respectively. Another end of the main portion 221 is in connection with the electronic components. By the aforementioned design, quantities of Schottky diodes can be increased.

According to one embodiment, the electrical substrate 11 is a silicon carbide substrate, the first electrically conductive dopant is an N-type dopant, the second electrically conductive dopant 121 is a P-type dopant, and the epitaxial layer 132 is a gallium nitride (GaN) epitaxial layer. In this embodiment, the electrical substrate 11 that is the silicon carbide substrate has low thermal mismatch with the epitaxial layer 132 that is the gallium nitride epitaxial layer, so that the gallium nitride epitaxial layer can easily grow on the silicon carbide substrate.

Referring further to FIG. 7, the present disclosure provides a power device 1. The power device 1 includes the electrical substrate 11, the epitaxial compound layer 13, the plurality of gates 14, the passivation layer 15, an electrically conductive body 16' (i.e., a structure formed by the second electrically conductive material 16 as mentioned above), the drain 17, the electrode layer 18, and a field plate 20. The electrical substrate 11 has a first surface 111 and a second surface 112 that is opposite to the first surface 111. The electrical substrate 11 has an epitaxial drift layer (not shown in the figure), and the epitaxial drift layer is doped with a first electrically conductive dopant. The electrical substrate 11 further has a plurality of doping regions 12. The doping regions 12 are located below the first surface 111, and any two adjacent ones of the doping regions 12 are spaced apart by a gap D. Each of the doping regions 12 is doped with a second electrically conductive dopant 121. The epitaxial compound layer 13 is located on the first surface 111 and includes the epitaxial layer 132. The gates 14 are located on the epitaxial compound layer 13. The passivation layer 15 covers the plurality of gates 14 and the epitaxial compound layer 13. The electrically conductive body 16' penetrates the passivation layer 15 and the epitaxial compound layer 13 and extends to the first surface 111, and a width of the electrically conductive body 16' is greater than the gap D. Two ends of electrically conductive body 16' are defined as the source contact 161 and the Schottky barrier contact 162, respectively. The drain 17 penetrates the passivation layer 15 and extends to the epitaxial layer 132. The field plate 20 is located on the passivation layer 15, and the field plate 20 shields the plurality of gates 14 and the electrically conductive body 16' and is in electrical connection with the electrically conductive body 16'. Details regarding the electrical substrate 11, the epitaxial compound layer 13, the plurality of gates 14, the passivation layer 15, the electrically conductive body 16', and the drain 17 can be referred to in the abovementioned descriptions of steps for manufacturing the power device 1, and will not be reiterate herein.

Reference is further made to FIG. 8. According to this embodiment, the power device 1 further includes the lead frame 19, the first metal pin 21, and the second metal pin 22. Details regarding the lead frame 19, the first metal pin 21, and the second metal pin 22 can be referred to in the abovementioned descriptions.

Reference is further made to FIG. 10. According to this embodiment, a portion of the first surface does not have the epitaxial compound layer 13 and is defined as the exposed portion 1111. The second metal pin 22 has the main portion 221 and the extension portion 222. One end of the main portion 221 is in connection with the source contact 161, and another end of the main portion 221 is in connection with the electronic components. Two ends of the extension portion 222 are in connection with the main portion 221 and the exposed portion 1111, respectively.

Beneficial Effects of the Embodiments

In conclusion, in the power device and the method for manufacturing the power device of the present disclosure, by technical solution of manufacturing a field-effect transistor on the electrical substrate and using the electrical substrate having the junction barrier Schottky to form a Schottky diode, the field-effect transistor can be integrated so that a Schottky diode can be disposed between a source and a drain of the field-effect transistor. In this way, the power device can release the inductance current received by the source to withstand a greater forward voltage.

Furthermore, in one implementation of the present disclosure, a gallium nitride epitaxial layer is grown on a silicon carbide substrate to form a gallium nitride field-effect transistor. Furthermore, the silicon carbide substrate has the junction barrier Schottky, and a thermal mismatch between the gallium nitride epitaxial layer and the silicon carbide substrate is decreased, so as to facilitate manufacturing of the gallium nitride field-effect transistor on the silicon carbide substrate having the junction barrier Schottky. In this way, the abovementioned effect of having the Schottky diode disposed between the source and the drain of the field-effect transistor can be achieved, and the functions of the Schottky diode can be exhibited.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for manufacturing a power device, comprising:
    providing an electrical substrate having a first surface and a second surface that is opposite to the first surface, and an electrode layer that is located on the second surface; wherein the electrical substrate further has an epitaxial drift layer, and the epitaxial drift layer is doped with a first electrically conductive dopant;
    doping the first surface with a second electrically conductive dopant to form a plurality of doping regions; wherein any two adjacent ones of the doping regions are spaced apart by a gap, and the first electrically conductive dopant and the second electrically conductive dopant have opposite electrical charges;
    forming an epitaxial compound layer on the electrical substrate, wherein the epitaxial compound layer includes an epitaxial layer;

disposing a plurality of gates on the epitaxial compound layer, wherein each of the plurality of gates is made of a first electrically conductive material;

forming a passivation layer that covers the plurality of gates and the epitaxial compound layer;

forming a first trench that extends from a surface of the passivation layer to the first surface and has a first end opening and a second end opening; wherein the first end opening is located between two of the gates that are adjacent to each other, the second end opening is located above the gap, and a width of the second end opening is greater than the gap;

filling a second electrically conductive material in the first trench to form a source contact at the first end opening, and form a Schottky barrier contact at the second end opening;

forming a second trench that extends from the surface of the passivation layer to a surface of the epitaxial layer;

filling a third electrically conductive material in the second trench to form a drain; and disposing a field plate on the passivation layer, wherein the field plate shields the plurality of gates and the source contact, and is in electrical connection with the source contact.

2. The method according to claim 1, wherein, after the step of disposing the field plate on the passivation layer, the method further comprises:

disposing a lead frame in connection with the electrode layer;

disposing a first metal pin, wherein two ends of the first metal pin are in connection with the drain and the lead frame, respectively; and disposing a second metal pin that is in connection with the source contact.

3. The method according to claim 1, wherein, after the step of forming the passivation layer, the method further comprises etching the passivation layer and the epitaxial compound layer so as to expose one portion of the first surface to define an exposed portion.

4. The method according to claim 3, wherein, after the step of disposing a field plate on the passivation layer, the method further comprises:

disposing a lead frame in connection with the electrode layer;

disposing a first metal pin, wherein two ends of the first metal pin are in connection with the drain and the lead frame, respectively; and disposing a second metal pin that has a main portion and an extension portion; wherein the main portion is in connection with the source contact, and two ends of the extension portion are in connection with the main portion and the exposed portion, respectively.

5. The method according to claim 1, wherein the electrical substrate is a silicon carbide substrate, the first electrically conductive dopant is an N-type dopant, and the second electrically conductive dopant is a P-type dopant; and wherein the epitaxial layer is a gallium nitride epitaxial layer.

6. A power device, comprising:

an electrical substrate having a first surface and a second surface that is opposite to the first surface, and an electrode layer that is located on the second surface; wherein the electrical substrate further has an epitaxial drift layer and a plurality of doping regions, and the epitaxial drift layer is doped with a first electrically conductive dopant; wherein the doping regions are located below the first surface and any two adjacent ones of the doping regions are spaced apart by a gap, and each of the doping regions is doped with a second electrically conductive dopant;

an epitaxial compound layer located on the electrical substrate and including an epitaxial layer;

a plurality of gates located on the epitaxial compound layer;

a passivation layer covering the plurality of gates and the epitaxial compound layer;

an electrically conductive body penetrating the passivation layer and the epitaxial compound layer and extending to the first surface, wherein a width of the electrically conductive body is greater than the gap;

a drain penetrating the passivation layer and extending to the epitaxial layer; and a field plate located on the passivation layer, wherein the field plate shields the plurality of gates and the electrically conductive body, and is in electrical connection with the electrically conductive body.

7. The power device according to claim 6, further comprising:

a lead frame being in connection with the electrode layer;

a first metal pin, wherein two ends of the first metal pin are in connection with the drain and the lead frame, respectively; and a second metal pin being in connection with the electrically conductive body.

8. The power device according to claim 6, further comprising:

an exposed region being located on the first surface;

a lead frame being in connection with the electrode layer;

a first metal pin, wherein two ends of the first metal pin are in connection with the drain and the lead frame, respectively; and a second metal pin having a main portion and an extension portion; wherein the main portion is in connection with the electrically conductive body, and two ends of the extension portion are in connection with the main portion and the exposed portion, respectively.

9. The power device according to claim 6, wherein the electrical substrate is a silicon carbide substrate;

wherein the first electrically conductive dopant is an N-type dopant;

wherein the second electrically conductive dopant is a P-type dopant; and wherein the epitaxial layer is a gallium nitride epitaxial layer.

* * * * *